United States Patent [19]

Sasaki

[11] Patent Number: 5,349,233
[45] Date of Patent: Sep. 20, 1994

[54] LEAD FRAME AND SEMICONDUCTOR MODULE USING THE SAME HAVING FIRST AND SECOND ISLANDS AND THREE DISTINCT PLURALITIES OF LEADS AND SEMICONDUCTOR MODULE USING THE LEAD FRAME

[75] Inventor: Akira Sasaki, Toda, Japan

[73] Assignee: Kabushiki Kaisha Toshiba, Kawasaki, Japan

[21] Appl. No.: 47,399

[22] Filed: Apr. 19, 1993

[30] Foreign Application Priority Data

Apr. 20, 1992 [JP] Japan ................... 4-099591

[51] Int. Cl.⁵ ............... H01L 23/48; H01L 29/44; H01L 29/52; H01L 29/60
[52] U.S. Cl. ................... 257/666; 257/676; 257/787
[58] Field of Search .......... 281/676, 666, 724, 723, 281/685, 787

[56] References Cited

U.S. PATENT DOCUMENTS

| | | | |
|---|---|---|---|
| 4,994,896 | 2/1991 | Uemura et al. | 257/724 |
| 5,245,215 | 9/1993 | Sawaya | 257/723 |
| 5,245,216 | 9/1993 | Sako | 257/723 |

FOREIGN PATENT DOCUMENTS

| | | | |
|---|---|---|---|
| 1-273343 | 11/1989 | Japan | 257/676 |
| 3-218059 | 9/1991 | Japan | 257/676 |

*Primary Examiner*—Rolf Hille
*Assistant Examiner*—S. V. Clark
*Attorney, Agent, or Firm*—Finnegan, Henderson, Farabow, Garrett & Dunner

[57] ABSTRACT

A lead frame for a semiconductor module comprises a lead frame member having first and second islands and including first, second and third groups of outer leads. The first and second groups of outer leads are located in one direction at opposed sides of the lead frame member, and the third group of outer leads are located between the first and second islands in the direction. When the first and second semiconductor chips are mounted on the first and second islands, respectively, and encapsulated separately with a resin layer, the third group of outer leads serve as external leads.

5 Claims, 3 Drawing Sheets

LEAD FRAME AND SEMICONDUCTOR MODULE USING THE SAME HAVING FIRST AND SECOND ISLANDS AND THREE DISTINCT PLURALITIES OF LEADS AND SEMICONDUCTOR MODULE USING THE LEAD FRAME

BACKGROUND OF THE INVENTION

1. Field of the Invention

The present invention relates to a packaging structure of a semiconductor chip, and more particularly, to a semiconductor module including a plurality of semiconductor chips.

2. Description of the Related Art

As personal electronic appliances represented by, for example, notebook type personal computers and electronic notebooks have become widely available, it has been increasingly required to minimize electronic components used therefore. Further, it has been also required to increase the packaging density of electronic components in electronic equipment such as EWSs (Engineering work Station) and super-computers in order to improve the performances. As described above, it is of high importance to achieve further minimization of electronic components. Moreover, it is also necessary to ensure the high reliability in these electronic components. A conventional semiconductor module, which is a typical electronic component, will be described as follows.

A semiconductor module 30 having, for example, two semiconductor chips will be explained with reference to FIGS. 4A and 4B.

Using a lead frame having an island 32 and leads 33, two semiconductor chips 31 are mounted on the island 32 at a predetermined position through a paste layer 34. A wiring substrate 35 having wiring layers 351 are further mounted on the island 32 through the paste layer 34 so as to be disposed between two semiconductor chips 31. The semiconductor chips 31 and the wiring substrate 35 are connected to one another via bonding wires 36, and the semiconductor chips 31 and the leads 33 are also connected to one another via the bonding wires 36. Therefore, these components are encapsulated with a resin layer 37 to provide a semiconductor module.

In the semiconductor module described above, since the adhesion of the resin layer 37 to the island 32 is bad, some moisture absorbed in the resin layer 37 and other moisture entering from an interface between leads 33 and the resin layer 37 gather at an interface between the lower surface of the island 32 and the resin layer 37. Therefore, much moisture thus gathered becomes water vapor due to a high temperature caused during packaging, thereby generating a large stress within the semiconductor module. As a result, when a thickness of the resin layer 37 (the thickness of the semiconductor module) becomes thin, unwanted cracks 38 occur in the resin layer or bonding wires are broken because the resin layer can not withstand the stress thus generated.

The break of the bonding wires can be easily detected by testing even after the module is attached to an electronic appliance. However, since it is difficult to detect the cracks 38 of the resin layer 37, the reliability of the electronic appliance is reduced. It is undesirable to reduce the resin layer 37 noticeably. This is because the thickness of the resin layer 37 is determined in proportion to the area of the island 32. Accordingly, for electrically connecting semiconductor chips 31 to each other, it is difficult to decrease the thickness of the resin layer 37 since the semiconductor module using the wiring substrate 35 has the large area of the island 32.

Further, during testing, it is difficult to measure separately the two semiconductor chips 31, and only the performance of the module is simply evaluated. Moreover, the use of the wiring substrate 35 results in an increase in the number of process steps, thereby increasing the manufacturing cost.

For protecting the resin layer 37 from the unwanted cracks 38, at any rate, it is necessary to increase the area of the island and to increase the thickness of the resin layer. Therefore, it is difficult to obtain the device minimization and to reduce the thickness of the device.

SUMMARY OF THE INVENTION

An object of the present invention is to provide a semiconductor module, such as resin-encapsulated semiconductor devices having a plurality of semiconductor chips, without using a wiring substrate.

Another object is to provide a thin semiconductor module, such as resin encapsulated semiconductor devices, having high reliability.

According to an aspect of the present invention, there is provided a lead frame for a semiconductor module, which comprises a lead frame member having first and second islands and including first, second and third groups of outer leads. The first and second groups of outer leads are located in one direction at opposed sides of the lead frame member, and the third group of outer leads are located between the first and second islands in the direction. When first and second semiconductor chips are mounted on the first and second islands, respectively, and encapsulated separately with a resin layer, the third group of outer leads serve as external leads.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings, in which:

DETAILED DESCRIPTION OF THE PREFERRED EMBODIMENTS

Figure 1:
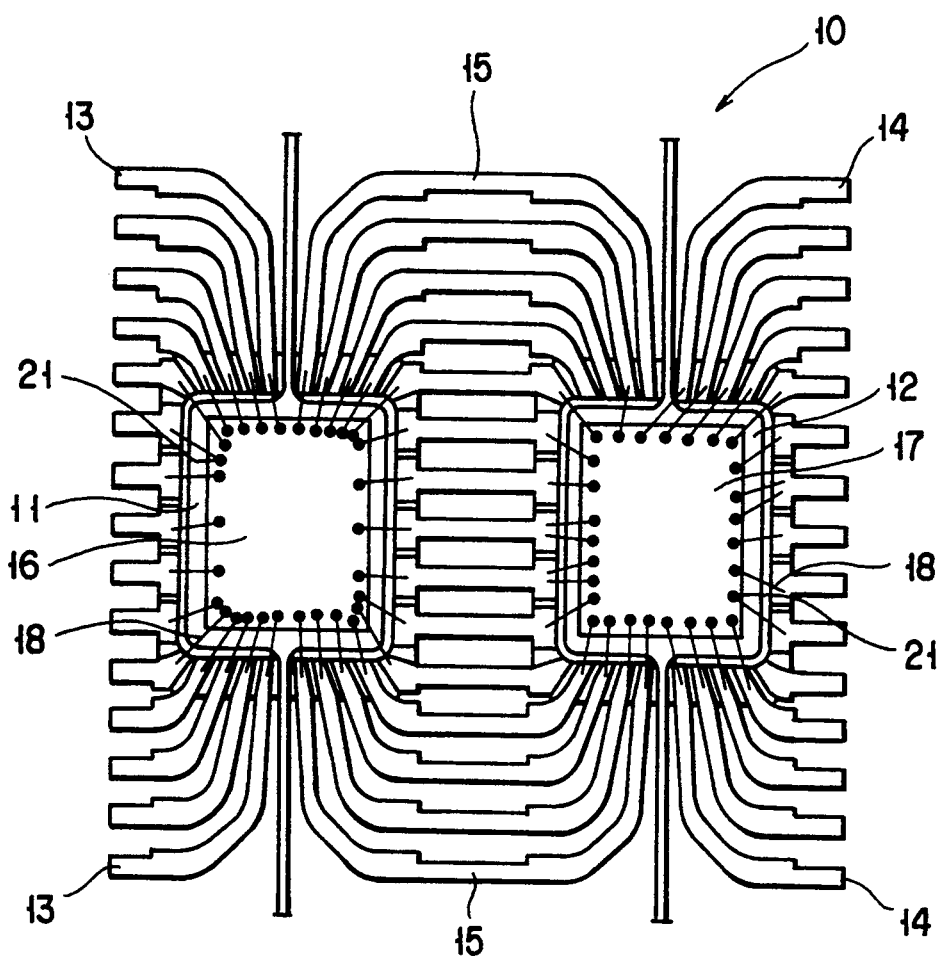
FIG. 1 is a plan view showing a semiconductor module, before encapsulation with resin, according to one embodiment of the present invention.

Embodiments of the present invention will be described below with reference to the accompanying drawings. The same reference numerals throughout the drawings denote the same parts.

Figure 2:
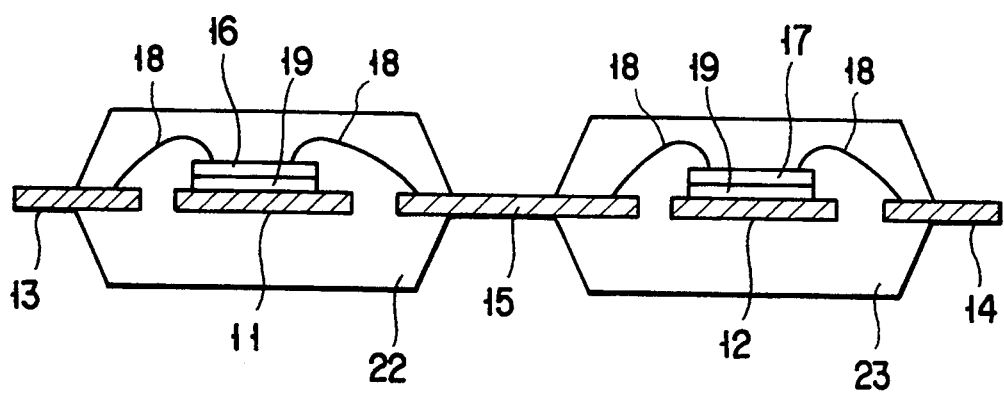
FIG. 2 is a cross sectional view showing a semiconductor module encapsulated with a resin layer according to the embodiment shown in FIG. 1.

As shown in FIG. 1, a lead frame 10 includes first and second islands 11 and 12 for mounting first and second semiconductor chips 16 and 17, respectively, first and second outer leads 13 and 14 to be connected to an external device, and third outer leads 15 for connecting the two semiconductor chips 16 and 17 to each other. The lead frame 10 is provided by etching or pressing a metal plate. Using the lead frame having such a configuration, two semiconductor chips 16 and 17 are mounted on the islands 11 and 12 through a paste layer 19 respectively, as shown in FIG. 2. Pads 21 formed on each semiconductor chip are connected to the first cr second leads 13 or 14 through bonding wires 18. Thereafter, the first and second semiconductor chips 16 and 17 are encapsulated with resin layers 22 and 23, respectively.

As apparent from FIG. 2, the first and second semiconductor chips are separately encapsulated with resin, and these semiconductor chips are electrically connected to each other through the third leads 15. That is, it is not necessary to dispose a specific wiring substrate within the semiconductor module. Therefore, it is not necessary to increase the island area and to increase the thickness of the resin layer in order to prevent the crack occurrence. In other words, the semiconductor module can be maintained at a predetermined thickness regardless of the number of semiconductor chips to be mounted within a single semiconductor module.

Figure 3A:
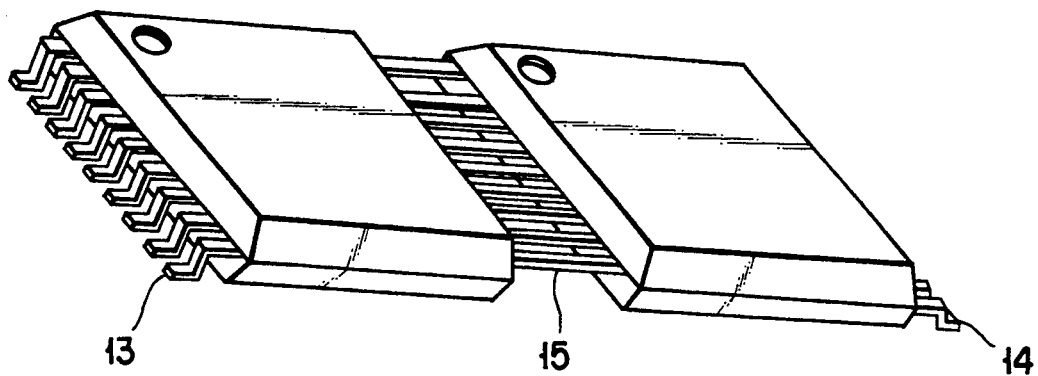
FIGS. 3A and 3B schematically show the semiconductor module of the present invention.
Figure 3B:
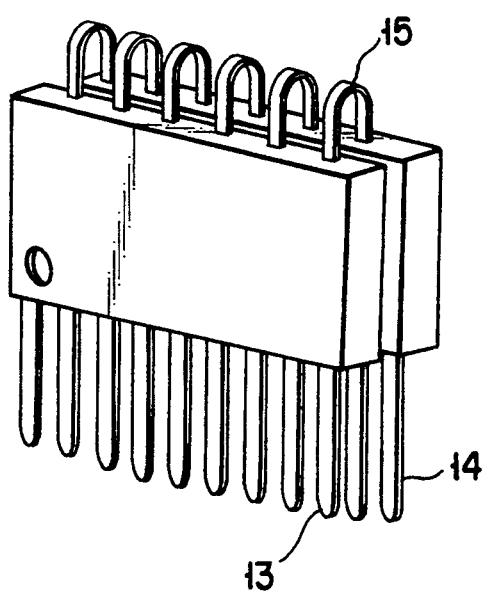
Figure 4A:
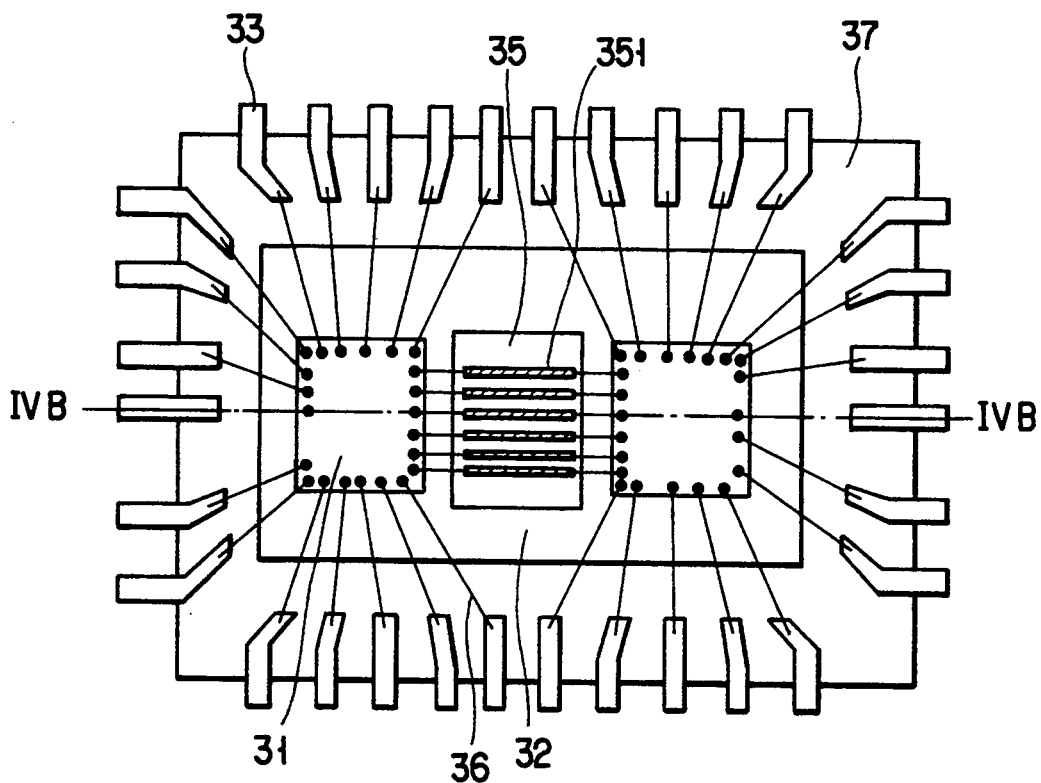
FIG. 4A a plan view showing a conventional semiconductor module.
Figure 4B:
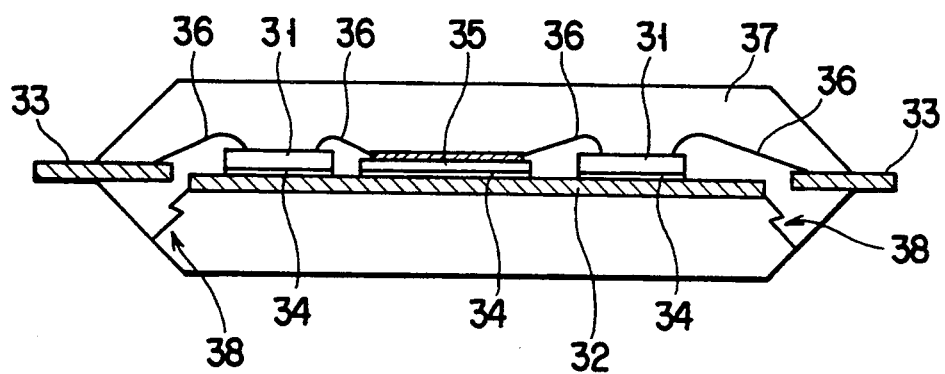
FIG. 4B is a cross sectional view along the line IVB-IVB shown in FIG. 4A.

FIGS. 3A and 3B show semiconductor modules each including two semiconductor chips as shown in FIG. 2. FIG. 3A shows an SOP (Small Outline package), while FIG. 3B shows an SIP (Single In-line Package). At any rate, each of the semiconductor chips is separately encapsulated with the resin layer, and these chips are connected to each other through the third leads 15. In addition, the first and second leads 13 and 14 are used for the external connections.

If a lead frame having more than two islands is employed, it is apparent that the present invention is applicable to a semiconductor module including more than two semiconductor chips.

As described above, according to the present invention, the island area can be reduced because each of the semiconductor chips is encapsulated with the resin layer. Therefore, it can be possible to decrease the thickness of the resin layer required for preventing the crack occurrence in the encapsulated resin, thereby providing a resin-encapsulated semiconductor device having a relatively small thickness and a relatively high performance. Further, the outer leads for connecting the semiconductor chips to each other are formed at the same time when the lead frame is made, and it is unnecessary to make the wiring substrate and to mount it on the island. Accordingly, the manufacturing process can be greatly simplified.

It is further understood by those skilled in the art that the foregoing description is only of the preferred embodiments and that various changes and modifications may be made in the invention without departing from the spirit and scope thereof.

What is claimed is:

1. A semiconductor module, comprising:
   a lead frame member having an axis, said lead frame member including:
      first and second islands spaced apart from each other; and
      first, second, and third pluralities of leads extending parallel to said axis,
      said first and second pluralities of leads extending outward from, said first and second islands; and
      all of said third plurality of leads extending between said first and second islands;
   first and second semiconductor chips mounted on said first and second islands, respectively, at least one of said chips being connected to at least one of said third plurality of leads; and
   first and second resin bodies separately encapsulating said first and second semiconductor chips, respectively, and exposing said third plurality of leads.

2. The semiconductor module according to claim 1, wherein said third plurality of leads comprise means for interconnecting said first and second semiconductor chips.

3. The semiconductor module according to claim 1, wherein the third plurality of leads define a plane and the first and second islands are arranged with respect to the plane to provide the module with an outline having a relatively low dimension in comparison to length along the axis.

4. The semiconductor module according to claim 1, wherein said third plurality of leads are bent and provide a so-called single in-line package, first and second ends of each of said third plurality of leads being substantially parallel to the axis.

5. The semiconductor module according to claim 1, wherein said first and second semiconductor chips have different functions.

* * * * *

UNITED STATES PATENT AND TRADEMARK OFFICE
CERTIFICATE OF CORRECTION

PATENT NO. : 5,349,233
DATED : September 20, 1994
INVENTOR(S) : Akira SASAKI et al It is certified that error appears in the above-indentified patent and that said Letters Patent is hereby corrected as shown below:

Claim 1, Column 4, Line 13 INDENT,

Claim 1, Column 4, Line 14 INDENT TWICE,

Claim 1, Column 4, Line 18 after "from" delete --,--.

Signed and Sealed this

Twenty-fifth Day of April, 1995

Attest:

BRUCE LEHMAN

Attesting Officer

Commissioner of Patents and Trademarks